(12) United States Patent
Tseng

(10) Patent No.: US 11,145,427 B2
(45) Date of Patent: Oct. 12, 2021

(54) TOOL AND METHOD FOR PARTICLE REMOVAL

(71) Applicant: Taiwan Semiconductor Manufacturing Co., Ltd., Hsinchu (TW)

(72) Inventor: Yu-Liang Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/917,918

(22) Filed: Jul. 1, 2020

(65) Prior Publication Data

US 2021/0035700 A1 Feb. 4, 2021

Related U.S. Application Data

(60) Provisional application No. 62/880,664, filed on Jul. 31, 2019.

(51) Int. Cl.
*G21K 1/00* (2006.01)

(52) U.S. Cl.
CPC .................................. *G21K 1/006* (2013.01)

(58) Field of Classification Search
CPC ........................................................ G21K 1/006
See application file for complete search history.

(56) References Cited

U.S. PATENT DOCUMENTS

| 7,628,865 | B2* | 12/2009 | Singh | G21K 1/003 |
| | | | | 134/1 |
| 7,772,531 | B2* | 8/2010 | Bradley | G02B 21/32 |
| | | | | 250/201.9 |
| 7,968,839 | B2* | 6/2011 | Merenda | G21K 1/006 |
| | | | | 250/251 |
| 2002/0115164 | A1* | 8/2002 | Wang | H05H 3/04 |
| | | | | 435/173.9 |
| 2003/0193984 | A1* | 10/2003 | Ozkan | H05H 3/04 |
| | | | | 372/93 |
| 2004/0209281 | A1* | 10/2004 | Monajembashi | G01N 21/645 |
| | | | | 435/6.12 |
| 2004/0256542 | A1* | 12/2004 | Okazaki | G02B 6/4249 |
| | | | | 250/227.11 |

(Continued)

FOREIGN PATENT DOCUMENTS

| CN | 1448496 | 10/2003 |
| CN | 101063830 | 10/2007 |

(Continued)

OTHER PUBLICATIONS

"Office Action of Taiwan Counterpart Application", dated Mar. 23, 2021, p. 1-p. 8.

(Continued)

*Primary Examiner* — Wyatt A Stoffa
(74) *Attorney, Agent, or Firm* — JCIPRNET

(57) ABSTRACT

A particle removal tool includes a workpiece holder and an optical tweezer. The workpiece holder is configured to support a workpiece. The optical tweezer is configured to emit a plurality of focused light beams to the workpiece, wherein the plurality of focused light beams are respectively converged to focal points between the optical tweezer and the workpiece, and are configured to take particles away from the workpiece.

20 Claims, 5 Drawing Sheets

(56) References Cited

U.S. PATENT DOCUMENTS

| | | |
|---|---|---|
| 2005/0081824 A1 | 4/2005 | Chen et al. |
| 2006/0086371 A1* | 4/2006 | Ohkubo .............. G03F 7/70925 |
| | | 134/1 |
| 2007/0188745 A1* | 8/2007 | Smedt ............... H01L 21/67288 |
| | | 356/237.2 |
| 2007/0251543 A1 | 11/2007 | Singh |
| 2010/0096371 A1 | 4/2010 | Bousquet et al. |
| 2013/0100461 A1* | 4/2013 | Wischnewski ......... G01B 11/14 |
| | | 356/614 |
| 2013/0341500 A1* | 12/2013 | Pascoguin ........... G03H 1/0005 |
| | | 250/251 |
| 2018/0059039 A1* | 3/2018 | Li ......................... G01N 24/10 |
| 2018/0202913 A1* | 7/2018 | Tanner ................... G01N 11/00 |
| 2020/0141852 A1* | 5/2020 | Ndukaife ............... G01N 15/00 |

FOREIGN PATENT DOCUMENTS

| | | |
|---|---|---|
| CN | 101404242 | 4/2009 |
| CN | 101603813 | 12/2009 |
| CN | 108351507 | 7/2018 |
| CN | 109887867 | 6/2019 |
| JP | 2007114403 | 5/2007 |
| KR | 20090103200 | 10/2009 |
| TW | 200602673 | 1/2006 |

OTHER PUBLICATIONS

"Office Action of China Counterpart Application", dated Jun. 17, 2021, with English translation thereof, p. 1-p. 27.

* cited by examiner

TOOL AND METHOD FOR PARTICLE REMOVAL

CROSS-REFERENCE TO RELATED APPLICATION

This application claims the priority benefit of U.S. provisional application Ser. No. 62/880,664, filed on Jul. 31, 2019. The entirety of the above-mentioned patent application is hereby incorporated by reference herein and made a part of this specification.

BACKGROUND

Semiconductor manufacturing includes various processes such as photolithography, etching, diffusion, and so on. Functional density has increased by decreasing a geometric size of components for integrated chips. Such scaling down process enhances production efficiency and lowers associated manufacturing costs. Removing debris and by-products from equipment, photomasks and wafers helps to improve production yield.

In some approaches, a cleaning solvent is sprayed on a surface to remove particles accumulated on the surface. In some approaches, a surface is scrubbed or polished to remove particles accumulated on the surface. However, the above-mentioned approaches may result in damages to the surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
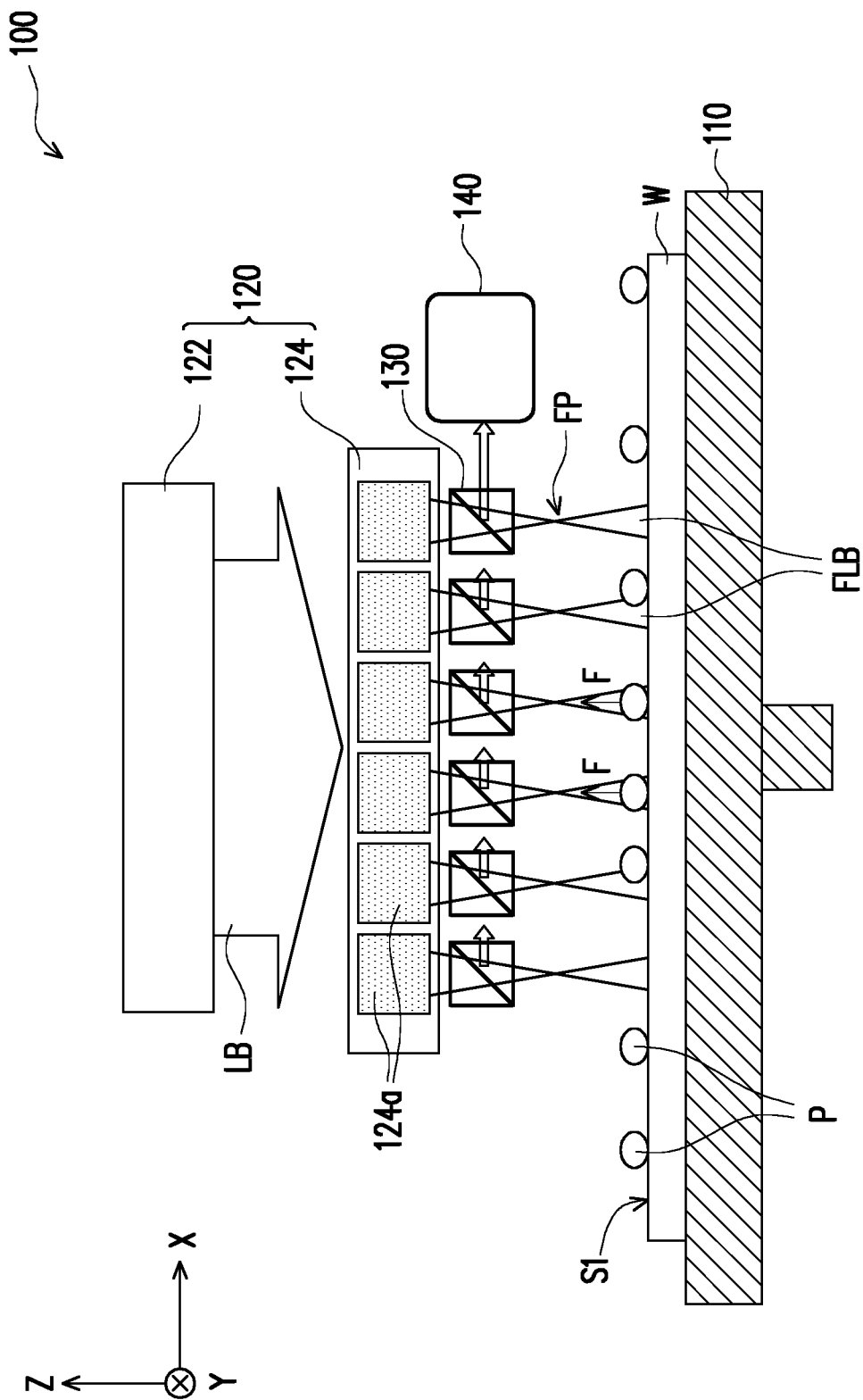
FIG. 1 is a schematic cross-sectional view of a particle removal tool according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a tool and a method for particle removal with an optical and non-contact process. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 is a schematic cross-sectional view of a particle removal tool according to some embodiments of the present disclosure. It should be noted that a particle removal tool is shown in a simplified manner, and some components are omitted for ease of illustration. Referring to FIG. 1, a particle removal tool 100 is provided. In some embodiments, the particle removal tool 100 includes a workpiece holder 110 and an optical tweezer 120. The workpiece holder 110 is configured to support a workpiece W. The optical tweezer 120 is configured to emit a plurality of focused light beams FLB to the workpiece W to pick up particles P on the workpiece 110.

In some embodiments, the workpiece holder 110 is positioned below the optical tweezer 120 and disposed downstream of the light propagation path of the plurality of focused light beams FLB. In some embodiments, the workpiece holder 110 has a mechanical structure or configuration that allows it to hold and/or move the workpiece W. For example, in some embodiments, the workpiece holder 110 includes a vacuum chuck (not shown) that generates vacuum pressures through vacuum ports in the chuck to hold the workpiece W thereon during a particle removal process. However, in alternative embodiments, the workpiece W is mounted by other appropriate mounting force via the workpiece holder 110. In some embodiments, the particle removal tool 100 includes a controller (not shown) that controls the workpiece holder 110 and/or a motor coupled to the workpiece holder 110 to rotate or spin according to a specific spin speed, spin duration, and/or a spin direction (e.g., clockwise or counterclockwise). In some embodiments, the controller controls the workpiece holder 110 to horizontally move (i.e., translate horizontally in two dimensions), so as to change the illumination position on the workpiece W. In some embodiments, the controller controls the workpiece holder 110 to vertically move, so as to change the distance between the optical tweezer 120 and the workpiece W. That is to say, the workpiece holder 110 may be movable, so that the workpiece W may be moved relative to the optical tweezer 120 by the workpiece holder 110. In some embodiments, the workpiece W is moved along X direction, Y direction, and/or Z direction by the workpiece holder 110. In some embodiments, the workpiece W is rotated by the workpiece holder 110. In some embodiments, the controller may be locally or remotely located from the particle removal tool 100. In some embodiments, the controller includes electronic memory and one or more electronic processors configured to execute programming instructions stored in the electronic memory. The disclosure is not intended to limit whether the functions of the controller is implemented by ways of software or hardware.

In some embodiments, the workpiece W includes a semiconductor wafer such as a crystalline silicon substrate; an elementary semiconductor substrate (e.g., including germanium); a compound semiconductor substrate (e.g., including silicon carbon, gallium arsenic, gallium phosphide, indium phosphide, indium arsenide, and/or indium antimonide); and/or an alloy semiconductor substrate (e.g., including SiGe, GaAsP, AlInAs, AlGaAs, GaInAs, GaInP, and/or GaInAsP). Other semiconductor substrates such as multi-layered or gradient substrates may also be used as a semiconductor wafer. In some embodiments, the workpiece W may include a semiconductor wafer having an integrated circuit (IC) structure formed thereon. The IC structure may include semiconductor devices, and further include a stack of dielectric and conductive layers stacked on the semiconductor devices which serve as an interconnect structure. In some embodiments, the workpiece W may include a semiconductor wafer having an unfinished integrated circuit (IC) structure formed thereon. In other words, a particle removal process may be performed on the semiconductor wafer by the particle removal tool 100 before and/or after any intermediate process step (e.g., etching process, deposition process, thermal process and so on) of the IC structure. However, the present disclosure is not limited thereto. In some alternative embodiments, the workpiece W may be other parts such as masks, reticles, robots, etc.

In some embodiments, the focused light beams FLB emitted from the optical tweezer 120 are configured to take particles P away from the workpiece 110. In detail, the optical tweezer 120 may include a light source 122 over the workpiece holder 110 and an optical component 124 between the light source 122 and the workpiece holder 110. The light source 122 is configured to emit a light beam LB. The optical component 124 is disposed on a transmission path of the light beam LB, and is configured to convert the light beam LB into the plurality of focused light beams FLB. In some embodiments, the light beam LB is provided as a continuous wave (CW) laser. In some embodiments, the light beam LB is provided as a pulse laser. In some embodiments, the optical component 124 includes a plurality of optical lenses 124a, and each of the plurality of optical lenses 124a is illuminated by the light beam LB. In other words, the illumination range of the light beam LB may cover all of the optical lenses 124a. In some embodiments, the optical lenses 124a have positive refractive power, so that the light beam LB are focused and converted into the plurality of focused light beams FLB by the optical lenses 124a. In some embodiments, the focused light beams FLB are separated from each other. In some embodiments, the focused light beams FLB are respectively converged to focal points FP between the optical tweezer 120 and the workpiece 110. In other words, a distance between the optical lenses 124a of optical tweezer 120 and the workpiece W may be greater than the focal length of the optical lenses 124a. In some embodiments, a distance between the focal points FP of the focused light beams FLB and the optical component 124 may range from about 2 µm to about 3 µm. In some embodiments, a distance between the focal points FP of focused light beams FLB and a surface S1 of the workpiece W may range from about 2 µm to about 3 µm. In some embodiments, the surface S1 of the workpiece W is a front-side surface of the workpiece W. In some embodiments, the surface S1 of the workpiece W is a back-side surface of the workpiece W. In some alternative embodiments, the surface of the workpiece irradiated by the focused light beams is a side surface connected between the front-side surface and the back-side surface of the workpiece.

Specifically, the optical tweezer 120 is an instrument that uses a highly focused laser beam (i.e., the focused light beams FLB) to provide an attractive or repulsive force, depending on the relative refractive index between the particles P and the surrounding medium. The optical tweezer 120 uses the forces of laser radiation pressure to physically hold and move nanometer and micron-sized particles P. The laser radiation pressure is a force per unit area on the particle P due to the change in momentum of light. The narrowest point (i.e., the focal point FP) of the focused laser beam (i.e., the focused light beam FLB) contains a strong electric field gradient, such that the particles P are attracted along the gradient to the positions of strongest electric field. Therefore, when the optical component 124 converts the light beam LB into the focused light beams FLB and the focused light beams FLB irradiate the particles P on the workpiece W, the particles P are attracted toward the focal points FP of the focused light beams FLB, and float in the space between the optical tweezer 120 and workpiece W. In this case, following the movement of the optical tweezer 120, the particles P attracted to the focal points FP are taken away, so that the particles P are removed.

The force on the particle P is given by the change in momentum of light due to refraction of the light by the particles P, and thus the total force on the particle P is the difference between the momentum flux entering the particle P and the momentum flux leaving the particle P. In some embodiments, the light source 122 with high power may be used to generate higher trapping force. In some embodiments, the light beam LB may have a laser power ranging from about 10 mW to about 100 mW, and a laser energy density ranging from about 0.01 mJ/cm$^2$ to about 140 mJ/cm$^2$. In some embodiments, the optical lenses 124a of the optical component 124 with high numerical aperture (NA) may be used to generate higher trapping force. In some embodiments, the optical lenses 124a of the optical component 124 may have numerical aperture (NA) ranging from about 0.9 to about 1.5. In further embodiments, if the laser power is less than about 10 mW, or the laser energy density is less than about 0.01 mJ/cm$^2$, or numerical aperture (NA) of the optical lenses 124a is less than about 0.9, then the trapping force is too small to attract the particle P away from the workpiece W. In yet further embodiments, if the laser power is greater than about 100 mW, or the laser energy density is greater than about 140 mJ/cm$^2$, or numerical aperture (NA) of the optical lenses 124a is greater than about 1.5, then the energy of the light beam LB is too strong such that the light beam LB may damage the surface of the workpiece W. In some embodiments, the force F provided by the optical tweezer 120 may range from about 0.001 pN to about 200 pN, which may be capable of picking up the particles P with size ranging from about 0.0001 µm$^3$ to about 20 µm$^3$.

In some embodiments, during a particle removal process, when the focused light beams FLB irradiate the workpiece W, the workpiece W is rotated 360 degrees by the workpiece holder 110. In some embodiments, when the focused light beams FLB irradiate the workpiece W, the workpiece W is moved along X direction and/or Y direction by the workpiece holder 110. Therefore, the particles P may be taken away from the workpiece W more efficiently.

During the fabrication of the integrated circuit (IC) devices, some cleaning solvents used in the wet cleaning process may lead to problems in fabrication, such as defect (e.g., line broken), damage, or film loss. For instance, cleaning solvents containing hydrogen fluoride (HF) may consume silicon oxides to reduce the thickness of the layer of silicon oxides. The film loss may result in difficulty in controlling critical dimension (CD) for some key steps and/or have impact on the performance and yield of the IC devices. Due to these factors, the wet cleaning process is not suitable or cannot be used for the semiconductor wafer in some process steps. In addition, some parts (e.g., EUV reticle) are very fragile, and the wet cleaning process may lead to broken of the parts. Therefore, different from the wet etching process, the particle removal process performed by the particle removal tool 100 according to some embodiments of the present disclosure is an optical and non-contact process, and thus the aforementioned problems are avoided.

Figure 2:
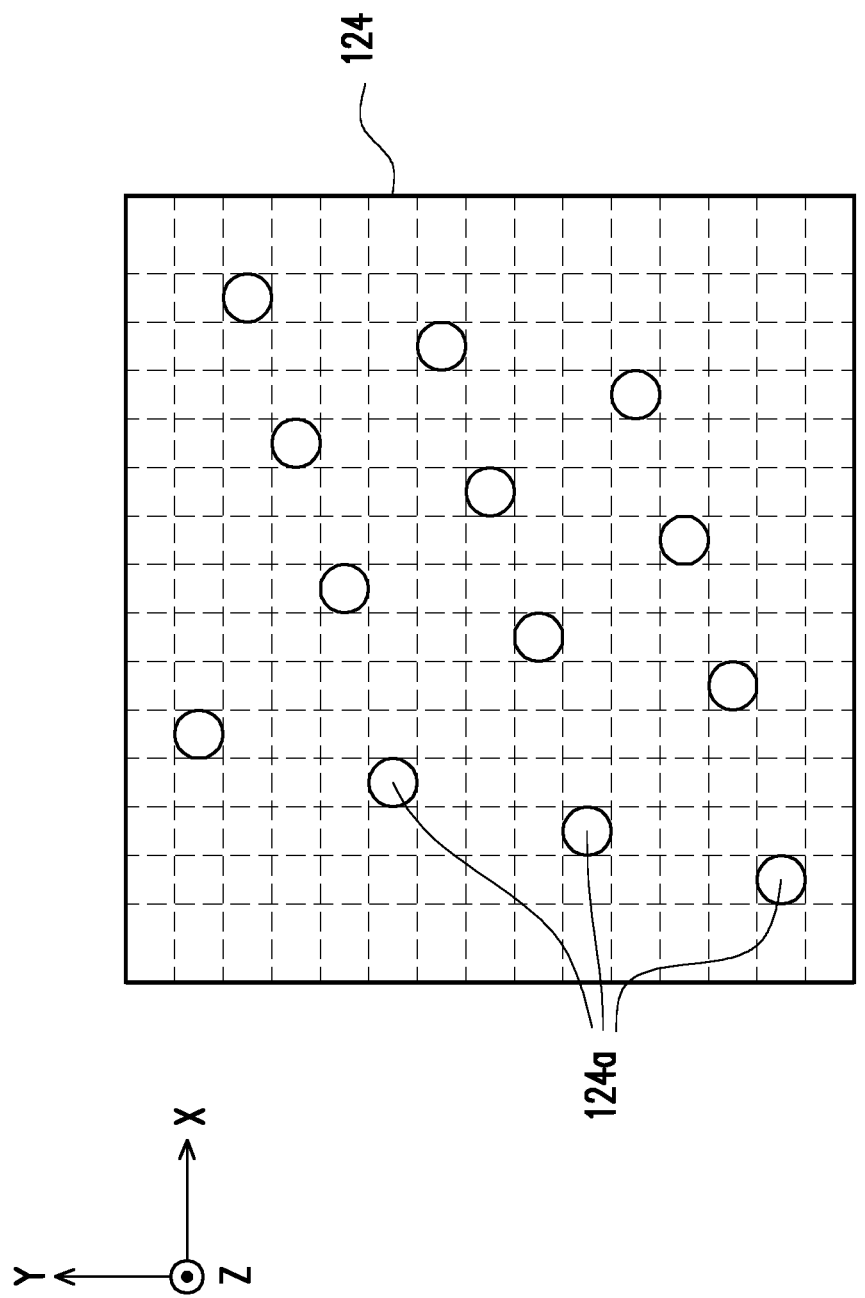
FIG. 2 is a schematic top view of an optical component of FIG. 1 according to some embodiments of the present disclosure.
Figure 3:
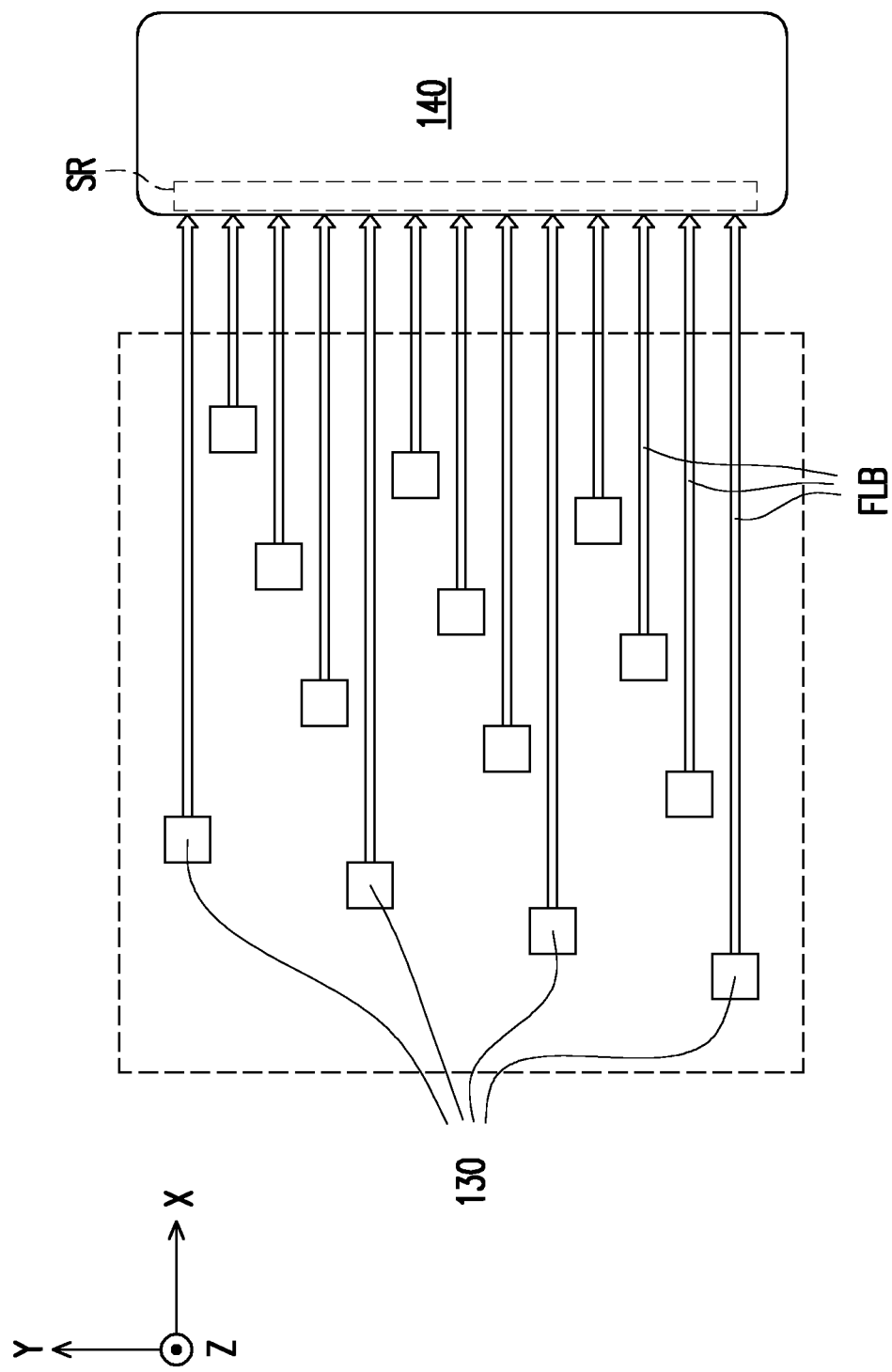
FIG. 3 is a schematic top view of beam splitters and a sensor of FIG. 1 according to some embodiments of the present disclosure.

FIG. 2 is a schematic top view of an optical component of FIG. 1 according to some embodiments of the present disclosure. FIG. 3 is a schematic top view of beam splitters and a sensor of FIG. 1 according to some embodiments of the present disclosure. For illustration purpose, the focused light beams FLB are also shown in FIG. 3. Referring to FIG. 1 to FIG. 3, the particle removal tool 100 may further include a plurality of beam splitters 130 and a sensor 140. In some embodiments, the beam splitters 130 are disposed on the transmission path of the focused light beams FLB, and are disposed between the optical tweezer 120 and the workpiece W. In some embodiments, the beam splitters 130 and the sensor 140 are disposed at the same level height. In some embodiments, the beam splitters 130 are configured to respectively deliver the plurality of focused light beams FLB from the optical tweezer 120 to the workpiece W, and respectively deliver the plurality of focused light beams FLB reflected by the workpiece W to the sensor 140. In some embodiments, the beam splitters 130 may partially allow the incident light to pass through and partially reflect the incident light, so that the focused light beams FLB from the optical tweezer 120 are delivered to the workpiece W by the plurality of beam splitters 130, are reflected by the workpiece W, and are delivered to the sensor 140 by the beam splitters 130 in sequence. In detail, when the focused light beams FLB from the optical tweezer 120 irradiate the beam splitters 130, the beam splitters 130 split the focused light beams FLB into first transmitted portions and first reflected portions, wherein the first transmitted portions of the focused light beams FLB are delivered to the workpiece W, and the first reflected portions of the focused light beams (not shown for ease of illustration) are reflected by the beam splitters 130. Thereafter, the first transmitted portions of the focused light beams FLB are reflected by the workpiece W and delivered to the beam splitters 130, and the beam splitters 130 split the first transmitted portions of the focused light beams FLB into second transmitted portions and second reflected portions, wherein the second transmitted portions of the focused light beams (not shown for ease of illustration) pass through the beam splitters 130, and the second reflected portions of the focused light beams FLB are reflected by the beam splitters 130 and delivered to the sensor 140. In some embodiments, the beam splitter 130 may be a cube made from two triangular prisms, and the space between the triangular prisms are adjusted such that half of the focused light beam FLB is reflected and the other half is transmitted. However, the present disclosure does not limit the kinds of the beam splitters 130.

In some embodiments, the sensor 140 is configured to sense the plurality of focused light beams FLB from the workpiece W, such that positions of the particles P on the workpiece W are monitored by the sensor 140. In some embodiments, the sensor 140 includes a time delay and integration (TDI) sensor, or the like. In some embodiments, the sensing signal generated from the sensor 140 is transmitted to and processed by the aforementioned controller of the particle removal tool 100. In some embodiments, based on the monitoring results of the sensor 140, the aforementioned controller of the particle removal tool 100 may control the workpiece holder 110 to horizontally or vertically move, so as to change the illumination position on the workpiece W or the distance between the optical tweezer 120 and the workpiece W.

In some embodiments, the locations of the plurality of optical lenses 124a are staggered, and the locations of plurality of beam splitters 130 are staggered. In detail, as shown in FIG. 2, the optical lenses 124a of the optical components 120 are arranged in a virtual plane defined by a first direction (e.g., X direction) and a second direction (e.g., Y direction), and the optical lenses 124a are staggered in both of the first direction (e.g., X direction) and the second direction (e.g., Y direction). As shown in FIG. 3, the beam splitters 130 are arranged in a virtual plane defined by a first direction (e.g., X direction) and a second direction (e.g., Y direction), and the beam splitters 130 are staggered in both of the first direction (e.g., X direction) and the second direction (e.g., Y direction). In addition, each of the plurality of beam splitters 130 is aligned with one of the plurality of optical lenses 124a respectively in a third direction (e.g., Z direction) perpendicular to the first direction (e.g., X direction) and the second direction (e.g., Y direction). In other words, orthogonal projections of the plurality of optical lenses 124a onto the plurality of beam splitters 130 respectively overlap the corresponding beam splitters 130. In some embodiments, the number of the optical lenses 124a is the same as the number of the beam splitters 130.

Since the locations of the plurality of optical lenses 124a and the plurality of beam splitters 130 are staggered in both of the first direction (e.g., X direction) and the second direction (e.g., Y direction), the particle removal tool 100 removes the particles P in a more effective manner. Although thirteen optical lenses 124a and thirteen beam splitters 130 are illustrated in FIG. 2 and FIG. 3, the disclosure does not limit the number of the optical lenses 124a and the beam splitters 130.

In some embodiments, orthogonal projections of the beam splitters 130 onto a sensor region SR of the sensor 140 are staggered. In some embodiments, the sensor region SR of the sensor 140 faces toward the plurality of beam splitters 130. In some embodiments, the sensor region SR of the sensor 140 extends along the second direction (e.g., Y direction). In some embodiments, light propagation paths of the plurality of focused light beams FLB between the plurality of beam splitters 130 and the sensor 140 are spaced apart from each other. In some embodiments, the light propagation paths of the plurality of focused light beams FLB between the plurality of beam splitters 130 and the sensor 140 are parallel to each other. As a result, the plurality of focused light beams FLB from the workpiece W are transmitted to the sensor 140 without intersecting with each other, and thus the sensing result of the sensor 140 may not be affected. However, the present disclosure is not limited thereto, as long as the orthogonal projections of the beam splitters 130 onto the sensor region SR of the sensor 140 are staggered and the light propagation paths of the plurality of focused light beams FLB between the plurality of beam splitters 130 and the sensor 140 are spaced apart from each other. For instance, in some alternative embodiments, the beam splitters 130 are staggered in the second direction (e.g., Y direction) but not staggered in the first direction (e.g., X direction).

In some embodiments, the particle removal tool 100 may include a process chamber (not shown), and the light source 110, the optical tweezer 120, the beam splitter 130 and the sensor 140 are disposed in the process chamber. The process chamber may be a cleaning chamber for wafer cleaning, substrate cleaning, and/or part cleaning. However, the function of the process chamber is not limited in the present disclosure. In some alternative embodiments, other suitable process (e.g., etching process, thermal process or oxidation process) may be performed in the process chamber.

Figure 4:
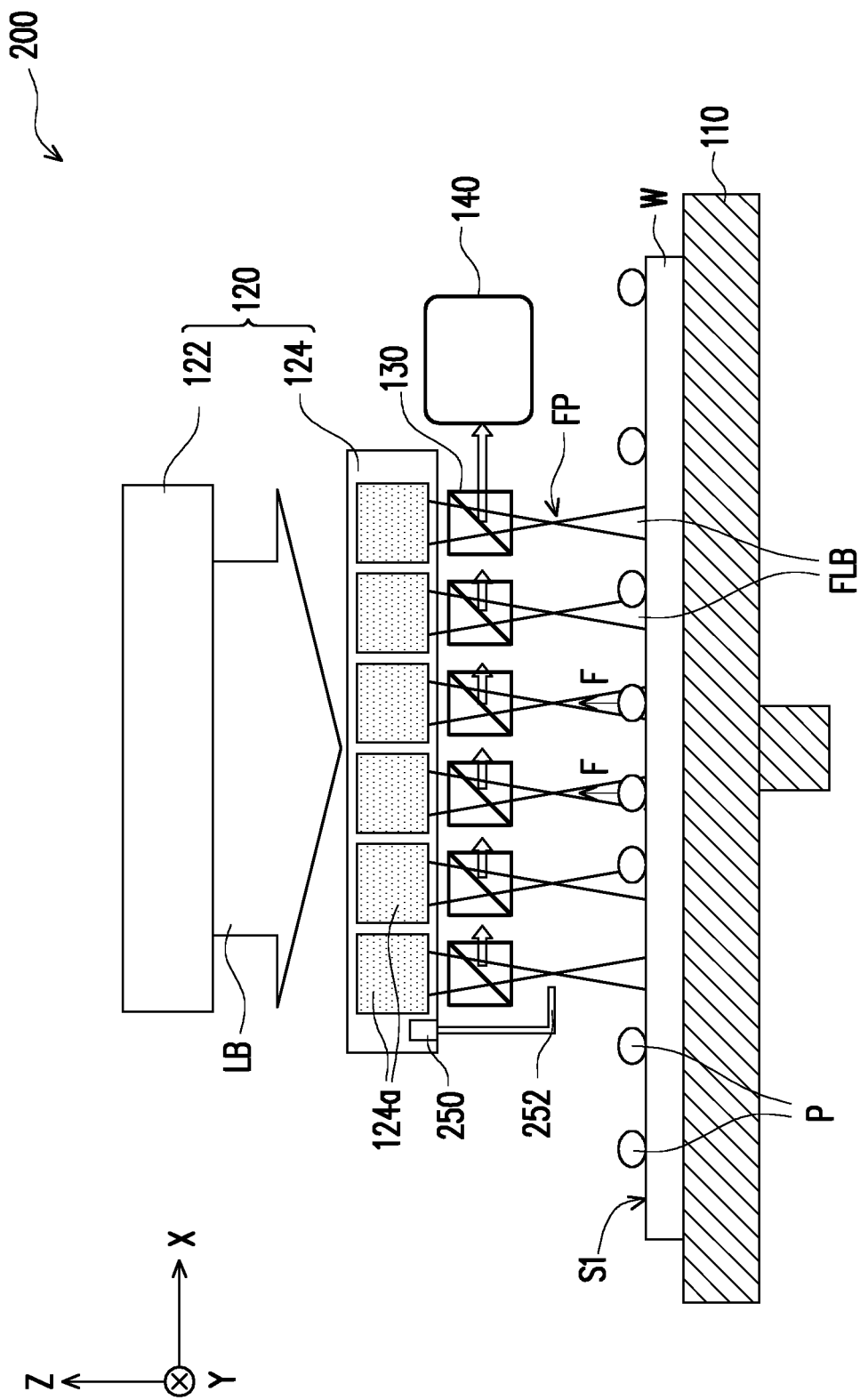
FIG. 4 is a schematic cross-sectional view of a particle removal tool according to some embodiments of the present disclosure.

FIG. 4 is a schematic cross-sectional view of a particle removal tool according to some embodiments of the present disclosure. Like elements are designated with the same reference numbers for ease of understanding and the details thereof are not repeated herein. It should be noted that a particle removal tool is shown in a simplified manner, and some components are omitted for ease of illustration.

Referring to FIG. 4, a particle removal tool 200 is provided. In some embodiments, the particle removal tool 200 may be similar to the particle removal tool 100 in FIG. 1, except that the particle removal tool 200 further includes an airflow unit (e.g., a pump 250). In some embodiments, the pump 250 is configured to collect the particles P taken away from the workpiece W. In some embodiments, the pump 250 may include, for example, a suction nozzle 252 having an inlet pore adjacent to the positions of the focal points FP of the focused light beam FLB. When the particles P on the workpiece W are attracted to the focal points FP of the focused light beams FLB, the pump 250 may generate vacuum pressure to pull in the particles P attracted to the focal points FP through the suction nozzle 252, so that the particles P are removed. In some embodiments, the pump 250 may have a power of about 300 W. In some embodiments, the change in pressure between the inlet and outlet of the pump 250 may be about 0.7 atm (approximately 7 N/cm$^2$).

During the fabrication of the integrated circuit (IC) devices, some cleaning solvents used in the wet cleaning process may lead to problems in fabrication, such as defect (e.g., line broken), damage, or film loss. For instance, cleaning solvents containing hydrogen fluoride (HF) may consume silicon oxides to reduce the thickness of the layer of silicon oxides. The film loss may result in difficulty in controlling critical dimension (CD) for some key steps and/or have impact on the performance and yield of the IC devices. Due to these factors, the wet cleaning process is not suitable or cannot be used for the semiconductor wafer in some process steps. In addition, some parts (e.g., EUV reticle) are very fragile, and the wet cleaning process may lead to broken of the parts. Therefore, different from the wet etching process, the particle removal process performed by the particle removal tool 200 according to some embodiments of the present disclosure is an optical and non-contact process, and thus the aforementioned problems are avoided.

Figure 5:
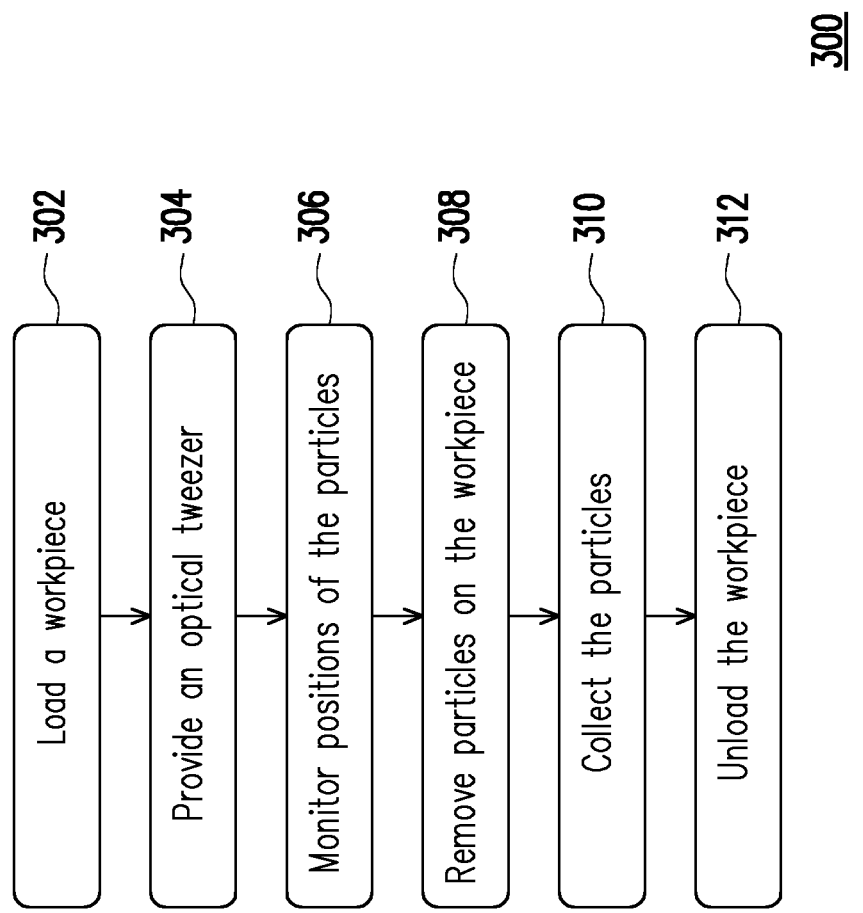
FIG. 5 is a flow chart of a method for particle removal according to some embodiments of the present disclosure.

FIG. 5 is a flow chart of a method for particle removal according to some embodiments of the present disclosure.

Although the method 300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a workpiece is loaded. In some embodiments, loading the workpiece includes providing a workpiece holder to support the workpiece. FIG. 1 and FIG. 4 illustrate the workpiece holder 110 configured to support the workpiece W. In some embodiments, the workpiece holder 110 has the mechanical structure or configuration that allows it to hold and/or move the workpiece W. In some embodiments, the workpiece holder 110 is rotated and/or horizontally or vertically moved, so that the workpiece W is moved relative to the optical tweezer 120 by the workpiece holder 110. In some embodiments, the workpiece W may include a semiconductor wafer. In some embodiments, the workpiece W may include other parts such as masks, reticles, robots, etc.

At act 304, an optical tweezer is provided. FIG. 1 and FIG. 4 illustrate the optical tweezer 120 configured to emit the plurality of focused light beams FLB to the workpiece W. The optical tweezer 120 includes the light source 122 configured to emit a light beam LB, and the optical component 124 configured to convert the light beam LB into the plurality of focused light beams FLB. In some embodiments, the optical component 124 may include the plurality of optical lenses 124a having positive refractive power, so that the light beam LB may be focused and converted into the plurality of focused light beams FLB. In some embodiments, the focused light beams FLB are separated from each other. In some embodiments, the focused light beams FLB are respectively converged to focal points FP between the optical tweezer 120 and the workpiece 110. In other words, a distance between the optical lenses 124a of optical tweezer 120 and the workpiece W is greater than the focal length of the optical lenses 124a.

At act 306, positions of the particles are monitored. FIG. 1 and FIG. 4 illustrate the sensor 140 configured to sense the plurality of focused light beams FLB from the workpiece W. FIG. 1 and FIG. 4 also illustrate the plurality of beam splitters 130 configured to respectively deliver the plurality of focused light beams FLB from the optical tweezer 120 to the workpiece W, and respectively deliver the plurality of focused light beams FLB reflected by the workpiece W to the sensor 140. In some embodiments, each of the plurality of beam splitters 130 is aligned with one of the plurality of optical lenses 124a respectively in the third direction (e.g., Z direction). In some embodiments, the locations of plurality of beam splitters 130 are staggered, and the orthogonal projections of the beam splitters 130 onto the sensor region SR of the sensor 140 are staggered, so that the focused light beams FLB from the workpiece W are transmitted to the sensor 140 without intersecting with each other, and thus the sensing result of the sensor 140 may not be affected. In some embodiments, the sensor 140 includes a time delay and integration (TDI) sensor, or the like.

At act 308, the particles on the workpiece are removed. FIG. 1 and FIG. 4 illustrate the particles P are attracted toward the focal points FP of the focused light beams FLB when the optical component 124 converts the light beam LB into the focused light beams FLB and the focused light beams FLB irradiate the particles P, so that the particles P are removed from the workpiece W.

In some embodiments, act 308 is performed after act 306. However, the present disclosure is not limited thereto. In alternative embodiments, the sequence of act 306 and act 308 may be exchanged as needed. In other words, act 308 may be performed before act 306. In yet alternative embodiments, act 306 and act 308 may be performed simultaneously. To be more specific, before the act 308, the particles P may be monitored to know the positions thereof. During the act 308 and/or after the act 308, the particles P may be monitored to make sure whether the particles P on the workpiece W are removed or not.

At act 310, the particles P are collected. In some embodiments, collecting the particles includes providing a pump. FIG. 4 illustrates the pump 250 configured to collect the particles P picked up by the workpiece W. In some embodiments, the pump 250 may include, for example, a suction nozzle 252 having an inlet pore adjacent to the positions of the focal points FP of the focused light beam FLB. When the particles P on the workpiece W are attracted to the focal points FP of the focused light beams FLB, the pump 250 may generate vacuum pressure to pull in the particles P attracted to the focal points FP through the suction nozzle 252, so that the particles P are removed. In some embodiments, act 310 may be optional.

At act 312, the workpiece is unloaded, and the particle removal process is completed. In some embodiments, the particle removal process may be performed before and/or after any intermediate process step (e.g., etching process, deposition process, thermal process and so on) of the IC structures. In some embodiments, a defect inspection may be performed between the particle removal process and the fabrication process of the IC structures. In some embodiments, the particle removal process may be performed between the defect inspection and the fabrication process of the IC structures.

In view of the above, with the method of the embodiments of the disclosure, the particles P are removed by the optical and non-contact process instead of the wet cleaning process. Therefore, some problems (such as, defect, damage, or film loss) induced by the wet cleaning process are avoided. Furthermore, the manufacturing yield may be improved.

In accordance with some embodiments of the disclosure, a particle removal tool includes a workpiece holder and an optical tweezer. The workpiece holder is configured to support a workpiece. The optical tweezer is configured to emit a plurality of focused light beams to the workpiece, wherein the plurality of focused light beams are respectively converged to focal points between the optical tweezer and the workpiece, and are configured to take particles away from the workpiece.

In accordance with some embodiments of the disclosure, a particle removal tool includes a workpiece holder, a light source and a plurality of optical lenses. The light source is configured to emit a light beam. The plurality of optical lenses are disposed on a transmission path of the light beam, and configured to convert the light beam into a plurality of focused light beams, wherein the plurality of focused light beams are respectively converged to focal points between the plurality of optical lenses and the workpiece, and are configured to take particles away from the workpiece.

In accordance with some embodiments of the disclosure, a method includes at least the following steps. A workpiece is loaded. An optical tweezer emitting a plurality of focused light beams to the workpiece is provided, wherein the plurality of focused light beams are respectively converged to focal points between the optical tweezer and the workpiece. Particles on the workpiece are removed by the plurality of focused light beams, such that the particles are removed from the workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A particle removal tool, comprising:
    a workpiece holder, configured to support a workpiece;
    an optical tweezer, configured to emit a plurality of focused light beams to the workpiece, wherein the plurality of focused light beams are respectively converged to focal points between the optical tweezer and the workpiece, and are configured to take particles away from the workpiece;
    a sensor, configured to sense the plurality of focused light beams from the workpiece; and
    a plurality of beam splitters, disposed between the optical tweezer and the workpiece, the plurality of beam splitters configured to respectively deliver the plurality of focused light beams from the optical tweezer to the workpiece, and respectively deliver the plurality of focused light beams reflected by the workpiece to the sensor.

2. The particle removal tool as claimed in claim 1, wherein the plurality of beam splitters are arranged in a virtual plane defined by a first direction and a second direction, and the plurality of beam splitters are staggered in both of the first direction and the second direction.

3. The particle removal tool as claimed in claim 1, wherein light propagation paths of the plurality of focused light beams between the plurality of beam splitters and the sensor are spaced apart from each other.

4. The particle removal tool as claimed in claim 1, wherein orthogonal projections of the plurality of beam splitters onto a sensor region of the sensor are staggered.

5. The particle removal tool as claimed in claim 1, further comprising:
    a pump, configured to collect the particles taken away from the workpiece.

6. The particle removal tool as claimed in claim 1, wherein the workpiece holder is movable.

7. The particle removal tool as claimed in claim 1, wherein the optical tweezer comprises:
    a light source, configured to emit a light beam; and
    an optical component, disposed on a transmission path of the light beam, and configured to convert the light beam into the plurality of focused light beams.

8. The particle removal tool as claimed in claim 7, wherein the plurality of beam splitters are disposed between the optical component and the workpiece holder.

9. A particle removal tool, comprising:
    a workpiece holder, configured to support a workpiece; and
    a light source, configured to emit a light beam;

a plurality of optical lenses, disposed on a transmission path of the light beam, and configured to convert the light beam into a plurality of focused light beams, wherein the plurality of focused light beams are respectively converged to focal points between the plurality of optical lenses and the workpiece, and are configured to take particles away from the workpiece;

a sensor, configured to sense the plurality of focused light beams from the workpiece; and a plurality of beam splitters, disposed between the plurality of optical lenses and the workpiece, the plurality of beam splitters configured to respectively deliver the plurality of focused light beams from the plurality of optical lenses to the workpiece, and respectively deliver the plurality of focused light beams reflected by the workpiece to the sensor.

10. The particle removal tool as claimed in claim 9, wherein each of the plurality of beam splitters is aligned with one of the plurality of optical lenses respectively.

11. The particle removal tool as claimed in claim 9, wherein light propagation paths of the plurality of focused light beams between the plurality of beam splitters and the sensor are not intersected with each other.

12. The particle removal tool as claimed in claim 9, wherein orthogonal projections of the plurality of beam splitters onto a sensor region of the sensor are staggered.

13. The particle removal tool as claimed in claim 9, wherein the plurality of beam splitters are arranged in a virtual plane defined by a first direction and a second direction, and the plurality of beam splitters are staggered in both of the first direction and the second direction.

14. The particle removal tool as claimed in claim 9, wherein the plurality of beam splitters are disposed between the plurality of optical lenses and the workpiece holder.

15. A method for particle removal, the method comprising:

loading a workpiece;

providing an optical tweezer emitting a plurality of focused light beams to the workpiece, wherein the plurality of focused light beams are respectively converged to focal points between the optical tweezer and the workpiece;

removing particles on the workpiece by the plurality of focused light beams, such that the particles are removed from the workpiece;

monitoring the particles on the workpiece by a sensor; and providing a plurality of beam splitters between the optical tweezer and the workpiece, so that the plurality of focused light beams from the optical tweezer are delivered to the workpiece by the plurality of beam splitters, are reflected by the workpiece and are delivered to the sensor by the plurality of beam splitters in sequence.

16. The method as claimed in claim 15, wherein the particles are attracted toward the focal points of the plurality of focused light beams when the plurality of focused light beams irradiate the particles.

17. The method as claimed in claim 15, wherein the optical tweezer comprises:

a light source, configured to emit a light beam; and an optical component, disposed on a transmission path of the light beam, the optical component configured to convert the light beam into the plurality of focused light beams.

18. The method as claimed in claim 15, wherein the plurality of focused light beams from the workpiece are transmitted to the sensor without intersecting with each other.

19. The method as claimed in claim 15, further comprising:

providing an airflow unit to collect the particles picked up by the optical tweezer.

20. The method as claimed in claim 15, wherein:

loading the workpiece comprises providing a workpiece holder to support the workpiece, and moving the workpiece relative to the optical tweezer by the workpiece holder.

* * * * *